United States Patent
Manohara et al.

(10) Patent No.: US 9,250,148 B2
(45) Date of Patent: Feb. 2, 2016

(54) MULTI-DIRECTIONAL ENVIRONMENTAL SENSORS

(71) Applicant: California Institute of Technology, Pasadena, CA (US)

(72) Inventors: Harish Manohara, Arcadia, CA (US); Linda Y. Del Castillo, Arcadia, CA (US); Mohammed M. Mojarradi, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 20 days.

(21) Appl. No.: 13/834,283

(22) Filed: Mar. 15, 2013

(65) Prior Publication Data

US 2013/0247678 A1    Sep. 26, 2013

Related U.S. Application Data

(60) Provisional application No. 61/614,397, filed on Mar. 22, 2012.

(51) Int. Cl.
*G01L 1/00* (2006.01)
*G01B 7/16* (2006.01)
(Continued)

(52) U.S. Cl.
CPC ... *G01L 9/12* (2013.01); *G01K 1/00* (2013.01); *G01K 1/14* (2013.01); *G01L 5/165* (2013.01); *G01L 9/00* (2013.01); *G01L 9/0002* (2013.01); *G01P 9/02* (2013.01); *G01R 15/00* (2013.01)

(58) Field of Classification Search
CPC ............. G01L 9/12; G01L 9/00; G01L 5/165; G01L 9/0002; G01R 15/00; G01P 9/02; G01K 1/14; G01K 1/00; H01G 4/06; Y10T 29/417; G01F 1/692; G01F 1/56

USPC ................ 73/760, 861.12, 204.26; 29/25.03; 361/524
See application file for complete search history.

(56) References Cited

U.S. PATENT DOCUMENTS 5,473,304 A    12/1995    Friese et al.
5,827,415 A    10/1998    Gur et al.
(Continued)

FOREIGN PATENT DOCUMENTS

JP    03129914 A    6/1991
WO    2013142246 A1    9/2013
(Continued)

OTHER PUBLICATIONS

Ghosh et al., "Nanodiamond lateral field emission vacuum logic OR gate", Electronics Letters, Aug. 4, 2011, vol. 47, No. 16, 2 pgs.
(Continued)

*Primary Examiner* — Lisa Caputo
*Assistant Examiner* — Brandi N Hopkins
(74) *Attorney, Agent, or Firm* — KPPB LLP (57) ABSTRACT

Systems and methods in accordance with embodiments of the invention implement multi-directional environmental sensors. In one embodiment, a multi-directional environmental sensor includes: an inner conductive element that is substantially symmetrical about three orthogonal planes; an outer conductive element that is substantially symmetrical about three orthogonal planes; and a device that measures the electrical characteristics of the multi-directional environmental sensor, the device having a first terminal and a second terminal; where the inner conductive element is substantially enclosed within the outer conductive element; where the inner conductive element is electrically coupled to the first terminal of the device; and where the outer conductive element is electrically coupled to the second terminal of the device.

23 Claims, 6 Drawing Sheets

(51) Int. Cl.
*G01L 9/12* (2006.01)
*G01R 15/00* (2006.01)
*G01L 9/00* (2006.01)
*G01K 1/00* (2006.01)
*G01C 19/02* (2006.01)
*G01L 5/16* (2006.01)
*G01K 1/14* (2006.01)

(56) References Cited

U.S. PATENT DOCUMENTS

| | | | |
|---|---|---|---|
| 5,867,886 | A | 2/1999 | Ratell et al. |
| 6,819,542 | B2 | 11/2004 | Guo et al. |
| 7,647,833 | B1 | 1/2010 | Oboodi et al. |
| 7,990,676 | B2 | 8/2011 | Topaloglu |
| 8,796,932 | B2 | 8/2014 | Manohara et al. |
| 8,860,114 | B2 | 10/2014 | Yen et al. |
| 2002/0047154 | A1 | 4/2002 | Sowlati et al. |
| 2003/0036244 | A1 | 2/2003 | Jones et al. |
| 2004/0174655 | A1 | 9/2004 | Tsai et al. |
| 2008/0061700 | A1 | 3/2008 | Blick |
| 2008/0180883 | A1 | 7/2008 | Palusinski et al. |
| 2009/0090626 | A1 | 4/2009 | Holt et al. |
| 2009/0225490 | A1 | 9/2009 | Liao et al. |
| 2010/0009511 | A1 | 1/2010 | Quinlan et al. |
| 2010/0020468 | A1 | 1/2010 | Tan et al. |
| 2010/0028074 | A1 | 2/2010 | Etling |
| 2010/0085672 | A1 | 4/2010 | Savin et al. |
| 2010/0177461 | A1 | 7/2010 | Tuncer |
| 2010/0264032 | A1 | 10/2010 | Bazant |
| 2010/0308435 | A1 | 12/2010 | Nowak et al. |
| 2011/0049674 | A1 | 3/2011 | Booth, Jr. et al. |
| 2012/0017408 | A1 | 1/2012 | Masuda et al. |
| 2013/0249598 | A1 | 9/2013 | Manohara et al. |
| 2013/0250479 | A1 | 9/2013 | Manohara et al. |
| 2013/0342953 | A1 | 12/2013 | Subramanyam |
| 2014/0029161 | A1 | 1/2014 | Beidaghi et al. |
| 2014/0290381 | A1 | 10/2014 | Manohara et al. |
| 2015/0048482 | A1 | 2/2015 | Shih |

FOREIGN PATENT DOCUMENTS

| | | |
|---|---|---|
| WO | 2014153547 A1 | 9/2014 |
| WO | 2013142246 A8 | 10/2014 |

OTHER PUBLICATIONS

Grzybowski, et al., "High Temperature Performance of Polymer Film Capacitors", Journal of Microelectronic Packaging, 1998, pp. 711-716.
Manohara, et al., "Carbon Nanotube-Based Digital Vacuum Electronics and Miniature Instrumentation for Space Exploration", Proc. of SPIE vol. 7594, 75940Q-1, Apr. 13, 2010.
Manohara, et al., "Carbon Nanotube-Based High Temperature Vacuum Microelectronics for E&P Applications", SPE 156947, Jun. 12, 2012.
Manohara et al., "11.2: "Digital" Vacuum Microelectronics: Carbon Nanotube-Gased Inverse Majority Gates for High Temperature Applications", IEEE, 2010, pp. 203-204.
Nusil Silicone Technology LLC, "Conductive Silicones in Elevated Temperatures", 5 pgs.
Search Report & Written Opinion, "International Application PCT/US2013/031285, completed Jun. 26, 2013, 9 pgs.
Sergent, "Discrete Passive Components for Hybrid Circuits, Chapter 8, 40 pgs."
Wacker, "High-Performance Silicones for Transmission and Distribution", 52 pgs.
Zhang et al., "Lateral vacuum microelectronic logic gate design", J. Micromech. Microeng., 1991, pp. 126-134.
Chen, B. X. et al., "Approximate Calculating Methods Concerning the Electron Transit Time for a Vacuum Microelectronics Triode," J. Phys. D: Appl. Phys 33 (2000) L39-L43, Nov. 24, 1999.
International Search Report and Written Opinion for International Application No. PCT/US2013/031285, report completed Jun. 26, 2013, Mailed Jun. 26, 2013, 9 pages.
International Preliminary Report on Patentability for International Application PCT/US2013/031285, report completed Jun. 26, 2013, 7 Pgs.
International Search Report and Written Opinion for International Application PCT/US2014/031511, report completed Aug. 8, 2014, 10 pgs.
International Preliminary Report on Patentability for International Application PCT/US2014/031511, Report Issued Sep. 22, 2015, Mailed Oct. 1, 2015, 8 Pgs.
Invitation to Respond to Written Opinion for Singapore Application 11201404773Y, Report dated May 22, 2015, Mailed Jun. 18, 2015, 6 Pgs.
Manohara, Harish, et al., "High-Current-Density Field Emitters Based on Arrays of Carbon Nanotube Bundles," Journal of Vacuum Science and Technology B, vol. 23 (1), pp. 157-161 (2005).

MULTI-DIRECTIONAL ENVIRONMENTAL SENSORS

CROSS-REFERENCE TO RELATED APPLICATIONS

The current application claims priority to U.S. Provisional Application No. 61/614,397, filed Mar. 22, 2012, the disclosure of which is incorporated herein by reference.

STATEMENT OF FEDERAL FUNDING

The invention described herein was made in the performance of work under a NASA contract, and is subject to the provisions of Public Law 96-517 (35 U.S.C. 202) in which the Contractor has elected to retain title.

FIELD OF THE INVENTION

The present invention generally relates to multi-directional environmental sensors.

BACKGROUND

Sensors that monitor environmental parameters are widely used to provide and/or enhance the functionality of many engineered structures. For example, temperature sensors are often included within electronic circuitry to help prevent the circuitry from over-heating. Similarly, temperature sensors can also be used to monitor the temperature of an engine (e.g. automobile engine) to also help prevent it from overheating. Pressure sensors and strain gauges can also be used to facilitate the viability of engineered structures. For example, these gauges can measure to what extent a mechanical structure is being stressed and/or strained, and thereby determine whether the structure's failure load is being approached. Accordingly, it would be useful to develop more robust and versatile environmental sensors that can withstand more rigorous engineering applications.

SUMMARY OF THE INVENTION

Systems and methods in accordance with embodiments of the invention implement multi-directional environmental sensors. In one embodiment, a multi-directional environmental sensor includes: an inner conductive element that is substantially symmetrical about three orthogonal planes; an outer conductive element that is substantially symmetrical about three orthogonal planes; and a device that measures the electrical characteristics of the multi-directional environmental sensor, the device having a first terminal and a second terminal; where the inner conductive element is substantially enclosed within the outer conductive element; where the inner conductive element is electrically coupled to the first terminal of the device; and where the outer conductive element is electrically coupled to the second terminal of the device.

In another embodiment, the inner conductive element is substantially spherical; and the outer conductive element is substantially spherical.

In a further embodiment, the device that measures the electrical characteristics of the multi-directional environmental sensor measures its capacitance; and the inner conductive element and the outer conductive element are separated by ambient air.

In yet another embodiment, a multi-directional environmental sensor includes a medium that is disposed in between the inner conductive element and the outer conductive element, and thereby separates the inner conductive element and the outer conductive element.

In a yet further embodiment, the medium is a dielectric medium.

In still another embodiment, the device measures the electrical characteristics of the multi-directional environmental sensor measures its capacitance.

In a still further embodiment, when at least a threshold amount of pressure is applied to the outer conductive element, the distance between the inner conductive element and outer conductive element changes as a function of the applied pressure.

In still yet another embodiment, a multi-directional environmental sensor includes comprising circuitry that relates the electrical characteristics to the pressure applied to the multi-directional environmental sensor.

In a still yet further embodiment, the dielectric material is a compressible foam.

In another embodiment, the conductivity of the medium is correlated with the extent to which the medium is strained.

In a further embodiment, the medium comprises silicone and fillers that induce conductivity within the silicone.

In yet another embodiment, the fillers are one of: ECS1, ECS2, ECS3, ECS4, ECS5, ECS6, and mixtures thereof.

In a yet further embodiment, the device that measures the electrical characteristics of the multi-directional environmental sensor measures the conductance of the multi-directional environmental sensor.

In still another embodiment, when at least a threshold amount of pressure is applied to the outer conductive element, the distance between the inner conductive element and outer conductive element changes as a function of the applied pressure.

In a still further embodiment, a multi-directional environmental sensor includes circuitry that relates the electrical characteristics to the pressure applied to the multi-directional environmental sensor.

In a still yet further embodiment, a multi-directional environmental sensor includes a temperature sensor.

In another embodiment, the temperature sensor is one of: a thermocouple, a thermistor, a resistance temperature detector, and a pyrometer.

In a further embodiment, a multi-directional environmental sensor includes a plurality of strain-sensing resistors that are electrically coupled to the device that measures the electrical characteristics of the multi-directional environmental sensor.

In yet another embodiment, a multi-directional environmental sensor includes a micro-gyroscope.

In a yet further embodiment, a multi-directional environmental sensor includes a 5-line robust liquid crystal polymer-based bus line.

In still yet another embodiment, a multi-directional environmental sensor includes a device that wirelessly transmits data from the multi-directional environmental sensor.

In another embodiment, a multi-directional environmental sensor includes at least one more conductive element disposed in between the inner conductive element and the outer conductive element.

In a still further embodiment, a method of monitoring the structural properties of a cement-based structure, includes: submerging at least one multi-directional environmental sensor within a cement-based mixture in its non-solid form; where the at least one multi-directional environmental sensor can obtain data pertaining to structural properties; and fabricating a cement-based structure to be monitored using the cement-based mixture.

DETAILED DESCRIPTION

Turning now to the drawings, systems and methods for implementing multi-directional sensors are illustrated. In many instances, it is useful to be able to detect aspects of the surrounding environment within a liquid or a solid body. For example, it may be useful to know the pressure within a liquid at a given depth. Similarly, in many instances, it may be useful to know the pressure and strain at various nodes within a cement-based structure. In this way the structural aspects of the structure can be monitored, and any damage that would result from the failure of the structure can be avoided.

Accordingly, in many embodiments, a multi-directional environmental sensor includes an inner conductive element, an outer conductive element, and a device that measures the electrical characteristics of the multi-directional environmental sensor. The inner conductive element can be substantially enclosed by the outer conductive element, and the two conductive elements can be separated by a medium. The device can have first and second terminals for connecting to the conductive elements, and it can measure for example, the capacitance of the multi-directional environmental sensor (e.g. the inner conductive element, the outer conductive element, and any medium that separates the two). The device may also measure the conductance of the sensor. These electrical characteristics may then be correlated with any of a variety of environmental parameters, e.g. pressure. For example, if pressure is applied to the outer conductive element, the distance between the outer conductive element and the inner conductive element can decrease. Accordingly, this can result in a change in the capacitance of the sensor. The sensor can then relay this data either via a cable or wirelessly. Similarly, the sensor can be powered via a cable, or it can include an integrated power source.

The inner conductive element and outer conductive element can be substantially symmetrical about three orthogonal planes—for example, they can be spheres, or they can be cubes. In this way, the multi-directional sensor can be adapted to measure environmental parameters, e.g. pressure, along at least three separate directions. When the inner conductive element and the outer conductive element are substantially spherical, the sensor can be adapted to measure environmental parameters irrespective of orientation. This aspect can be useful for example in the case where, as the device is embedded within a solid structure, its orientation becomes unknown. In some embodiments, the environmental sensor includes a device that can detect and communicate its orientation, e.g. a micro-gyroscope can detect orientation. Similarly, the environmental sensor can also include a device that communicates the spatial location of the sensor. In this way, where the environmental sensor is embedded within a solid structure, it can relay its precise location so that any measurements that it communicates can be related to the precise location.

Figure 1:
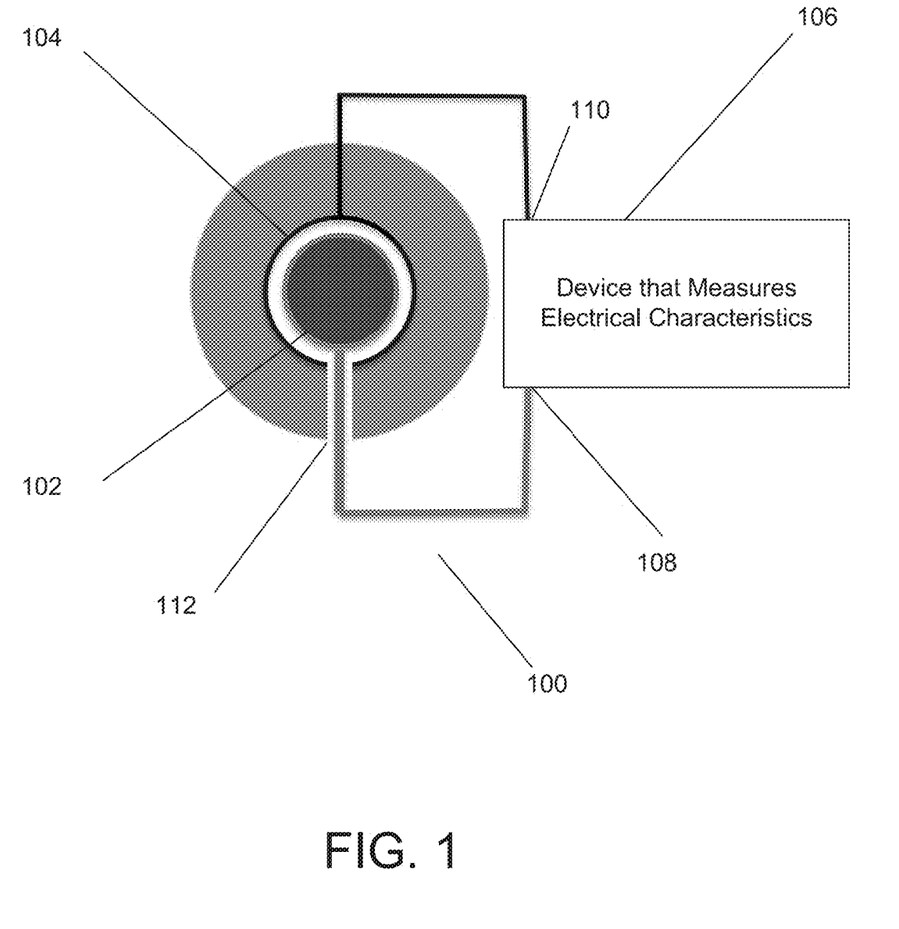
FIG. 1 illustrates a multi-directional environmental sensor in accordance with embodiments of the invention.

FIG. 1 illustrates a spherical multi-directional environmental sensor in accordance with an embodiment of the invention. In the illustrated embodiment, the multi-directional environmental sensor 100 includes an inner conductive element 102, an outer conductive element 104, and a device that measures electrical characteristics 106 having a first terminal 108 and a second terminal 110. The inner conductive element 102 and outer conductive element 104 are spherical and are thereby substantially symmetric about three orthogonal planes. Of course the conductive elements need not be exactly symmetrical—for example, the outer conductive element includes an opening 112, so that the device can be electrically coupled to the inner conductive element. And of course, the conductive elements need not be spherical in shape—they can be any suitable shape in accordance with embodiments of the invention. The electrical characteristics measured by the device can be correlated with environmental metrics (e.g. including, but not limited to, pressure), and thus, the device can indicate any of a variety of environmental measurements.

Moreover, in many embodiments, multi-directional environmental sensors can further include other sensors. For instance, in some embodiments, the multi-directional environmental sensor includes a temperature sensor. In many embodiments, resistors that can sense strain are integrated with the multi-directional environmental sensors. In this way, the multi-directional environmental sensor can communicate multiple environmental parameters, e.g., pressure, temperature, and strain.

Multi-directional environmental sensors can be used in a host of applications. For example, they can be embedded within a solid structure at various nodes to indicate the status of the structure at those nodes, and this information can be used to determine the continued viability of the structure. For example, if the sensors have indicated that the structure has been repeatedly excessively loaded, it can be determined that the structure may no longer be safe. In some instances, the multi-directional environmental sensors are embedded within cement-based structures, by disbursing them within the cement-based mixture prior to its hardening.

The operation of multi-directional environmental sensors is now discussed below in greater detail.

Multi-Directional Environmental Sensors that Detect Environmental Parameters by Measuring the Sensor's Capacitance In many embodiments, multi-directional environmental sensors detect environmental parameters by measuring a change in capacitance of the conductive elements. The capacitance of a capacitor is generally a function of the distance of two conductive elements—generally, the lesser the distance between the two conductive elements, the greater the capacitance. For example, the capacitance of a spherical capacitor, where a first spherical shell is centrally disposed within a second spherical shell and separated by a vacuum is:

$$C = 4\pi \epsilon_0 (r_a r_b / (r_b - r_a))$$

where:
C is the capacitance;
$\epsilon_0$ is the permittivity of free space;
$r_a$ is the radius of the first spherical shell; and
$r_b$ is the radius of the second spherical shell.

Of course, the capacitance of a capacitor can be increased by using a dielectric material to separate the conductive elements, as opposed to a vacuum. In these cases, the capacitance will be increased in proportion to a dielectric constant, K, which is a function of the dielectric material. Some dielectric materials and their dielectric constants are presented below in Table 1.

TABLE 1

Examples of Dielectric Materials and their Dielectric Constants

| Material | K |
| --- | --- |
| Vacuum | 1 |
| Air | 1.004 |
| Most Polymers | 2-6 |
| Highest Polymers | 16 |
| Celazole ® PBI (Polybenzimidazole) | 3.2 |
| Most Ceramics | 4-12 |
| $Al_2O_3$ | 9 |
| $Ta_2O_5$ | 25 |
| $TiO_2$ | 90 |
| $BaTiO_3$ | 1500 |
| $SiO_x$ | 3.9 |
| Ceramic Formulation Based | 20-15,000 |

The data in table 1 is drawn from J. E. Sergent, "Chapter 8: Discrete Passive Components for Hybrid Circuits," in *Hybrid Microelectronics Handbook*, Second Edition, J. E. Sergent and C. A. Harper, eds., McGraw-Hill, Inc., New York, 1995, pp. 8-1 to 8-40, the disclosure of which is hereby incorporated by reference.

Accordingly, in many embodiments a multi-directional pressure sensor is implemented. In particular, the multi-directional pressure sensor includes two conductive elements—an inner conductive element and an outer conductive element—electrically coupled to two respective terminals of a device that can measure capacitance. The inner and outer conductive elements are electrically separated, e.g. via air, vacuum, or a dielectric material. When pressure is applied to the outer conductive element, the multi-directional environmental sensor can be configured so that the distance between the inner conductive element and the outer conductive element lessens. For example, the inner and outer conductive elements can take the form of spheres—the inner conductive sphere being substantially housed within the outer conductive sphere, and a compressible dielectric material can be interposed between the inner conductive element and the outer conductive element. Accordingly, when pressure is applied, the separation distance between the inner and outer conductive element will decrease, and this will cause the capacitance to increase. The device that can measure capacitance can detect this increase in capacitance, which can then be correlated with the pressure that was applied to cause the decreased separation distance.

Figure 2A:
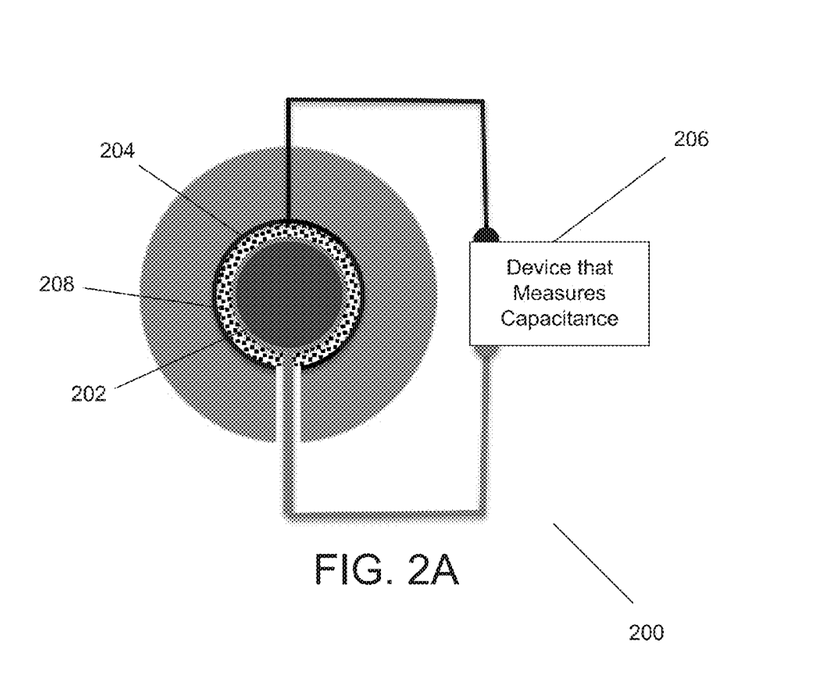
FIGS. 2A and 2B illustrate a multi-directional pressure sensor that detects pressure based on a change in capacitance in accordance with embodiments of the invention.
Figure 2B:
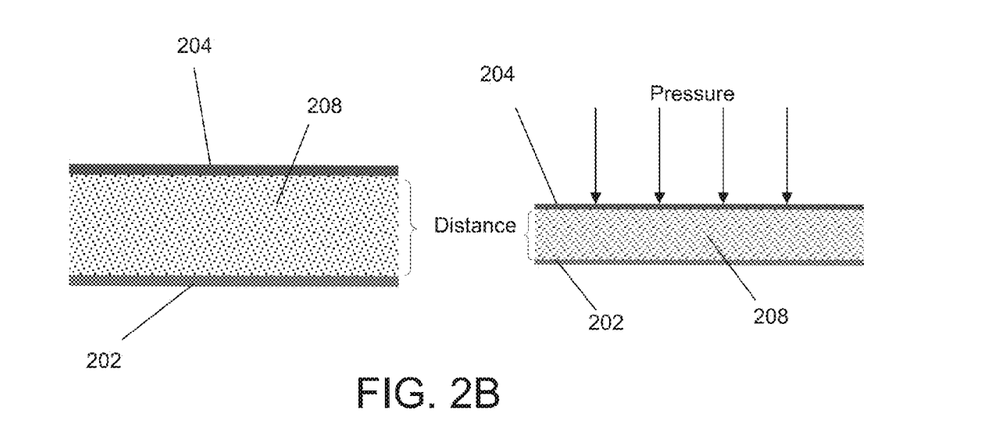

FIGS. 2A and 2B illustrate the operation of a multi-directional pressure sensor that uses capacitance to sense pressure in accordance with embodiments of the invention. In the illustrated embodiment, a multi-directional pressure sensor includes an inner conductive element 202 and an outer conductive element 204 that are electrically coupled to two terminals of a device that measures capacitance 206. A dielectric material 208 is interjected between the inner conductive element 202 and the outer conductive element 204. Preferably, the dielectric material is compressible. For instance, the dielectric material can be a compressible foam. Of course, any dielectric material can be used in accordance with embodiments of the invention. In some embodiments the inner conductive element and the outer conductive element are separated by ambient air. In a number of embodiments, the inner conductive element and the outer conductive element are separated by a vacuum.

As illustrated in FIG. 2B, when pressure is applied to the outer conductive element, the dielectric material 208 can compress, and the distance between the inner conductive element 202 and the outer conductive element 204 reduces. Accordingly, the device that measures capacitance 206 will detect an increase in capacitance, and the extent of this increase can be correlated with the applied pressure that caused the displacement. Essentially, the extent to which the dielectric material 208 is strained can be detected and correlated with the applied pressure. Of course, as one of ordinary skill in the art would appreciate, the multi-directional sensor can incorporate any type of circuitry to facilitate the computation of the applied pressure. In some embodiments, the multi-directional pressure sensor relays the capacitance measurements to a separate computer, so that the computer can perform the calculations.

Figure 3:
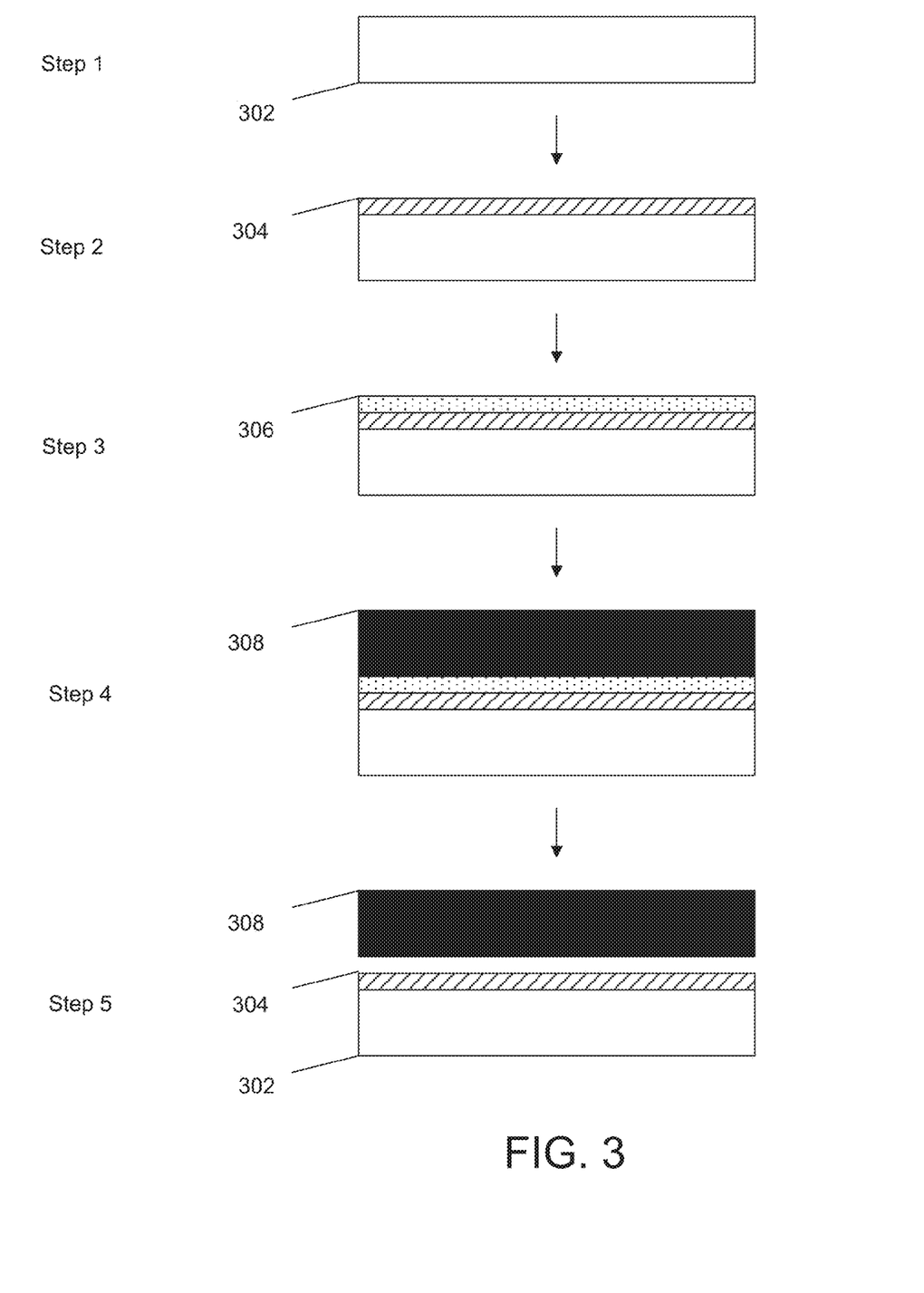
FIG. 3 illustrates the fabrication of a multi-directional pressure sensor that detects pressure based on a change in capacitance in accordance with embodiments of the invention.

A multi-directional pressure sensor can be fabricated in any number of ways in accordance with embodiments of the invention. For example, a series of layered material depositions can be used to fabricate spherical pressure sensor in accordance with embodiments of the invention. FIG. 3 illustrates a process for fabricating a spherical multi-directional pressure sensor that uses ambient air to separate the inner conductive element and the outer conductive element in accordance with an embodiment of the invention. In the illustrated embodiment, the process begins [Step 1] with a bare metallic sphere 302. An additional protective metal coating 304 may be deposited [Step 2] on the sphere. A low temperature polymer sacrificial layer coating 306 may be deposited [Step 3] on the sacrificial coating. And an outer conductive element 308 may be deposited [Step 4] on the sacrificial coating. The inner and outer conductive elements may be electrically coupled to the respective terminals of a device that measures their capacitance—the attachment to the terminals can serve to affix the spatial relationship of the inner conductive element and the outer conductive element. The sacrificial layer may be removed [Step 5], e.g. by melting away the layer, so that the area between the inner conductive element and the outer conductive element is hollow. Of course, instead of using a sacrificial layer 306, a dielectric material could be used which can make manufacturing easier. However a multi-directional environmental sensor that is hollow can be advantageous as it can be more sensitive to applied pressure. Although one process for manufacturing a multi-directional sensor has been discussed, a multi-directional sensor can be fabricated in any number of ways in accordance with embodiments of the invention.

Although multi-directional environmental sensors having two conductive elements have been discussed, in some embodiments, a multi-directional environmental sensor includes a plurality of conductive layers, and the electrical characteristics of the multi-directional environmental sensor including the plurality of conductive layers is detected and related to an environmental parameter to be measured. In essence, embodiments of the invention are not restricted to sensors that include only two conductive elements.

In addition to detecting environmental parameters by detecting a change in capacitance, environmental parameters can also be determined by detecting a change in conductance, and this is discussed below.

Conductance

In many embodiments, a multi-directional sensors detects environmental parameters by measuring a change in conductance of the sensor. For example, a conductive material can be disposed in between the inner conductive element and the outer conductive element, where the conductivity of the material is a function of to what extent it is strained.

Figure 4A:
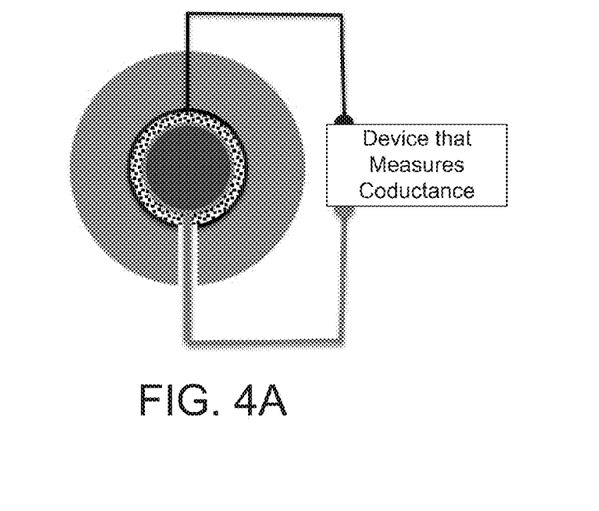
FIGS. 4A and 4B illustrate a multi-directional pressure sensor that detects pressure based on a change in conductance in accordance with embodiments of the invention.
Figure 4B:
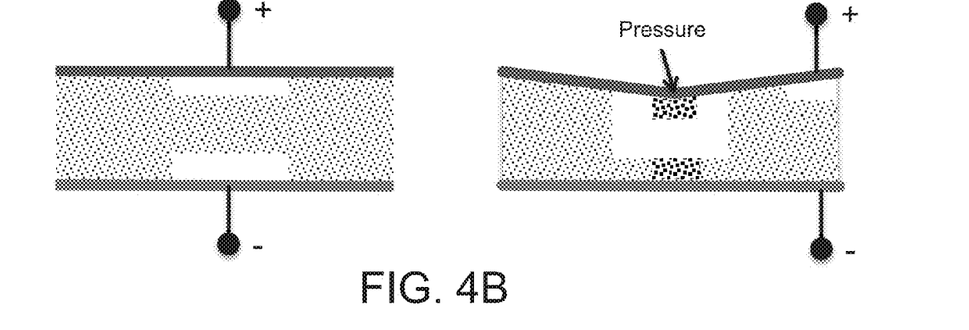

FIGS. 4A and 4B illustrate a multi-directional environmental sensor that determines applied pressure by measuring conductance in accordance with an embodiment of the invention. The multi-directional pressure sensor is similar to that seen in FIGS. 2A and 2B, except that it includes a device that measures conductance, and the material separating the inner conductive element from the outer conductive element is also conductive, but its conductivity is a function of the extent to which it is strained. FIG. 4B illustrates that when pressure is applied, the conductive material becomes compressed and its conductivity increases (indicated by the darkened dots) in relation to the extent to which it is compressed. Accordingly, the extent of compression, and hence the conductivity, can be correlated with the applied pressure. Of course, the multi-directional sensor can include circuitry for computing the applied pressure. In some embodiments, the electrical characteristics are relayed to a separate computer for performing any desired computation.

The compressible conductive material can be achieved in a number of ways. For example, silicone can be embedded with fillers (e.g. carbon fillers) that can increase its conductivity. Silicones may be used as they possess a number of beneficial material properties, including: low flammability, elasticity, and temperature stability. Of course, any type of fillers that increase conductivity can be used. For example, silver and gold fillers may be used to increase conductivity. In many embodiments, the filler material is one of the following manufactured by NuSil Technology LLC: ECS1 (Amorphous Carbon Black), ECS2 (Carbon Black Fibers), ECS3 (Silver Coated Metal Spheres), ECS4 (Silver Coated Fibers), ECS5 (Silver Coated Spheres), and ECS6 (Silver Coated Fibers). Similarly, any base material may be used that can be augmented so that its conductivity is a function of the extent it is strained. More generally, any material can be used that has a conductivity that is a function of the extent that it is strained. In some embodiments, the conductive material disposed between the inner conductive element and the outer conductive element has a foam type consistency. This may be beneficial so that the material can displace more easily, and thereby yield a more sensitive pressure sensor.

Of course, although using the capacitance and conductance of the sensor has been described in sensing environmental surroundings, any suitable electrical characteristic can be measured and related to the pertinent environmental metric in accordance with embodiments of the invention. Multi-directional environmental sensors can also include other sensing elements that can provide for enhanced functionality, and this is discussed below.

Integrated Multi-Directional Environmental Sensors

In many embodiments, the multi-directional sensors further include other sensing elements. For instance, in some embodiments temperature sensors can be integrated within the body of the outer conductive element. For example, thermocouples, thermistors, resistance temperature detectors, and/or pyrometers may be embedded in the sensor, although of course, any temperature sensing element can be used. Temperature sensors can also facilitate the operation of the multi-directional environmental sensor. For instance, the temperature of the sensor may impact the measured electrical characteristics, and this may be accounted for in relating the electrical measurements to the metric that is being measured, e.g. pressure. In many embodiments a multi-directional environmental sensor includes strain-sensing resistors. For example, the multi-directional pressure sensor can include a plurality of strain resistors so that both pressure and strain can be determined. Of course, any strain-sensing elements can be incorporated in accordance with embodiments of the invention.

Figure 5:
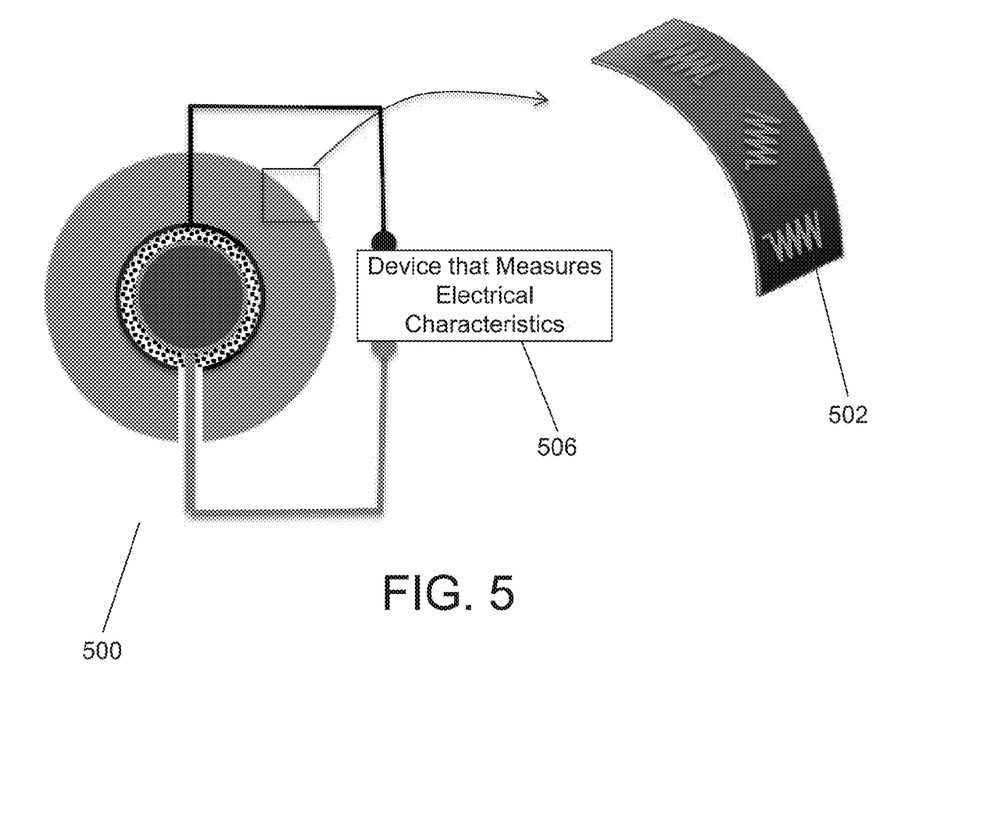
FIG. 5 illustrates a multi-directional pressure sensor that includes strain-sensing elements in accordance with embodiments of the invention.

FIG. 5 depicts a multi-directional environmental sensor that incorporates strain-sensitive resistors in accordance with embodiments of the invention. In the illustrated embodiment, the multi-directional pressure sensor 500 includes meander resistors 502 embedded on the surface of the outer conductive element. The meander resistors vary their resistance in proportion to the extent that they are strained. Thus, when the sphere becomes strained, the resistors will change their resistance in proportion to the extent of the strain. Of course, the resistors can be coupled with the device for measuring electrical characteristics 506 so that the strain can be detected. Note that a plurality of meander resistors can be integrated within the sensor so that strain in various directions can be measured. Moreover, the multi-directional sensor can also include a device that indicates the orientation of the sensor. For example, a micro-gyroscope can be embedded within the device. In this way, the spatial relationship of the strain-sensing resistors can be known, and any measured strain can be associated with a particular strain direction.

Although temperature sensors and strain sensors have been described, any suitable sensing elements can be integrated within the multi-directional environmental sensor in accordance with embodiments of the invention. The above-described multi-directional environmental sensors are substantially versatile and can be utilized in a host of applications. For example, they can be embedded within a solid structure so that the structural properties (e.g. stress and/or strain) can be monitored, and this is disclosed below.

Multi-Directional Environmental Sensors that can Monitor Structural Properties

In many embodiments, multi-directional environmental sensors are configured to be embedded within solid structures so as to measure their structural characteristics. For example, multi-directional environmental sensors can be embedded at nodes within solid structures, and thereby indicate to what extent the structural integrity has been and/or is being stressed. Thus, for example, the safety of the structure can be known.

Figure 6A:
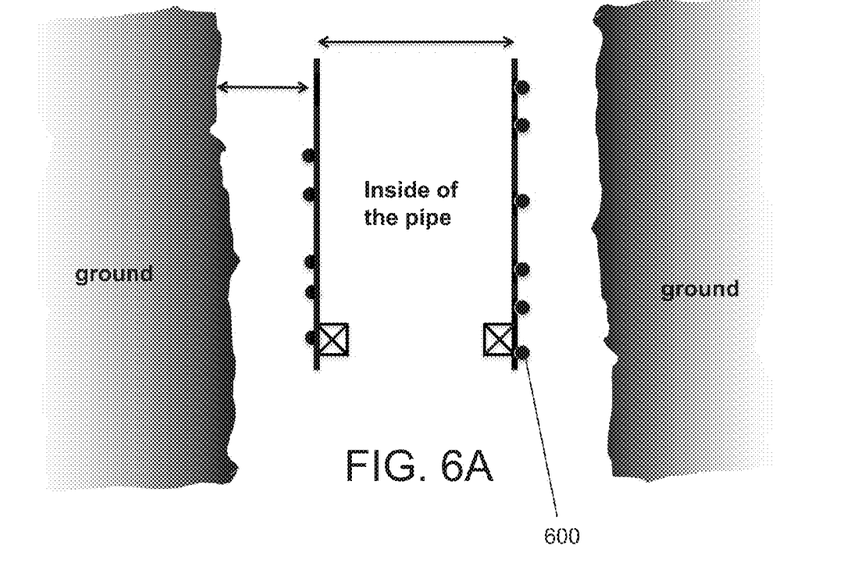
FIGS. 6A and 6B illustrate using tethered multi-directional sensors within cement-based structures to monitor the structural properties of the cement-based structures in accordance with embodiments of the invention.
Figure 6B:
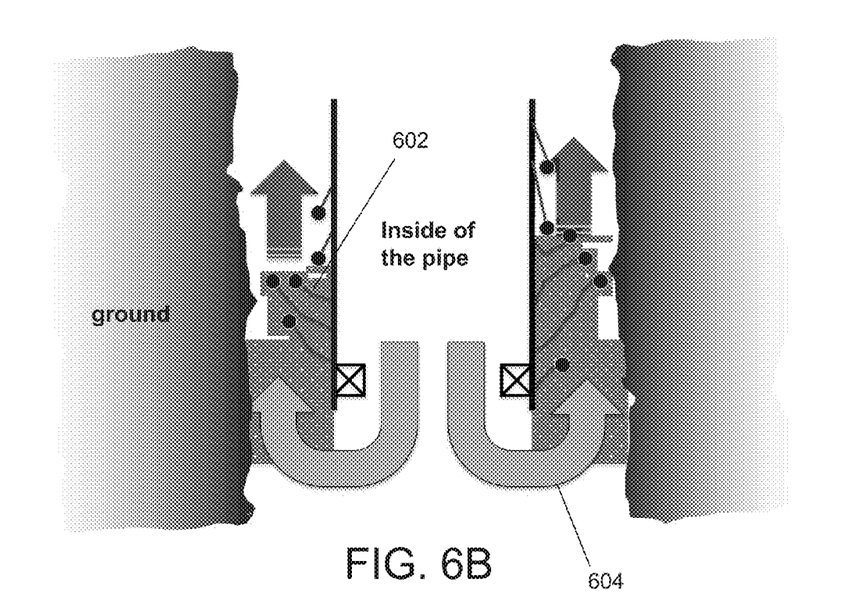

FIGS. 6A and 6B depict how multi-directional environmental sensors can be embedded within cement-based structures in accordance with embodiments of the invention. In the illustrated embodiment, a cement-based structure 604, will be used to secure a pipe in place. Before the introduction of the cement-based mixture, multi-directional environmental sensors 600 are tethered to the outside of the pipe wall. The tethers may be any suitable tethering material. Moreover, the tether can be capable of transmitting power and data to and from the sensor. For instance, in many embodiments, a 5-line robust liquid crystal polymer-based bus line is used to tether the sensor. Of course any tethering material can be used. When the cement-based mixture is introduced (e.g. in its non-solid form), the tethered sensors are released into the flow of the mixture, and are thereby disbursed and submerged within the mixture. Accordingly, when the cement-based mixture hardens, the multi-directional environmental sensors can remain embedded within the cement-based structure. Thus, the structural integrity of the cement-based structure can be monitored.

In many embodiments, the sensors include devices for wirelessly transmitting data, and thus do not need to rely on a tether to transmit the measurements. Moreover, in a number of embodiments, the sensors include a power source and therefore do not need to rely on an external power source to power the sensor via a tether. Accordingly, in many embodiments, multi-directional environmental sensors are disbursed within a cement-based mixture prior to its hardening without relying on any cables, wiring, or any other tethering material.

Additionally, the multi-directional sensors can include devices that communicate the spatial location and orientation of the sensors. Therefore, when the sensors get carried away by the cement-based mixture flow, their precise location and orientation can still be known, and the stress/strain measurements can be correlated accordingly.

The aforementioned multi-directional environmental sensors are particularly advantageous in that they employ an efficient design and do not excessively rely on moving parts. The sensors can also be fabricated from durable materials to withstand rigorous applications, and can thereby be made to be even more robust. For example, the sensors can be fabricated: so as to function within a temperature range from −40° F. to 400° F.; to withstand pressures ranging from 0 to 15,000 psi; to withstand seawater and subsurface environments; and to withstand corrosive environments. Thus, in many embodiments, the constituent materials are chosen to be able to meet one or more of these objectives. For example, ceramic materials, metallic carbides, silicon carbides, gallium nitrides, nanofibers and/or nanotube composites can be used. These materials are known to withstand high temperatures, high pressures, and corrosive environments. Moreover, ceramic coatings can be used to protect sensors and sensor parts from exposure to corrosive chemicals. Similarly, pressure protective packages can be used to provide protection from excessive pressure. Furthermore, the materials can be chosen so that the sensor is conducive to microfabrication and microassembly processes.

Additionally, the sensors can be configured to relay sensing data either continuously or periodically. Relaying data continuously can provide more comprehensive data, while relaying data periodically may reduce the sensor's power requirements.

Of course, although a particular application of multi-directional sensors has been elaborated on, the multi-directional environmental sensors described herein are substantially versatile, and can be used in a variety of applications. The above description is meant to be illustrative. Indeed, as can be inferred from the above discussion, the above-mentioned concepts can be implemented in a variety of arrangements in accordance with embodiments of the invention. Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. A multi-directional environmental sensor comprising:
   an inner conductive element that is contiguous and substantially symmetrical about each of three orthogonal planes;
   an outer conductive element that is contiguous and substantially symmetrical about each of three orthogonal planes; and
   a device that measures the electrical characteristics of the multi-directional environmental sensor, the device having a first terminal and a second terminal;
   wherein the outer surface of the outer conductive element defines a volume, and the inner conductive element is positioned entirely within the volume;
   wherein the inner conductive element is electrically coupled to the first terminal of the device; and
   wherein the outer conductive element is electrically coupled to the second terminal of the device.

2. The multi-directional environmental sensor of claim 1:
   wherein the inner conductive element is substantially spherical; and
   wherein the outer conductive element is substantially spherical.

3. The multi-directional environmental sensor of claim 2:
   wherein the device that measures the electrical characteristics of the multi-directional environmental sensor measures its capacitance; and
   wherein the inner conductive element and the outer conductive element are separated by ambient air.

4. The multi-directional environmental sensor of claim 2 further comprising a medium that is disposed in between the inner conductive element and the outer conductive element, and thereby separates the inner conductive element and the outer conductive element.

5. The multi-directional environmental sensor of claim 4, wherein the medium is a dielectric medium.

6. The multi-directional environmental sensor of claim 5, wherein the device measures the electrical characteristics of the multi-directional environmental sensor measures its capacitance.

7. The multi-directional environmental sensor of claim 6, wherein when at least a threshold amount of pressure is applied to the outer conductive element, the distance between the inner conductive element and outer conductive element changes as a function of the applied pressure.

8. The multi-directional environmental sensor of claim 7, further comprising circuitry that relates the electrical characteristics to the pressure applied to the multi-directional environmental sensor.

9. The multi-directional environmental sensor of claim 8, wherein the dielectric material is a compressible foam.

10. The multi-directional environmental sensor of claim 2, wherein the conductivity of the medium is correlated with the extent to which the medium is strained.

11. The multi-directional environmental sensor of claim 10, wherein the medium comprises silicone and fillers that induce conductivity within the silicone.

12. The multi-directional environmental sensor of claim 11, wherein the fillers are one of: ECS1, ECS2, ECS3, ECS4, ECS5, ECS6, and mixtures thereof.

13. The multi-directional environmental sensor of claim 10, wherein the device that measures the electrical characteristics of the multi-directional environmental sensor measures the conductance of the multi-directional environmental sensor.

14. The multi-directional environmental sensor of claim 13, wherein when at least a threshold amount of pressure is applied to the outer conductive element, the distance between the inner conductive element and outer conductive element changes as a function of the applied pressure.

15. The multi-directional environmental sensor of claim 14, further comprising circuitry that relates the electrical characteristics to the pressure applied to the multi-directional environmental sensor.

16. The multi-directional environmental sensor of claim 15, further comprising a temperature sensor.

17. The multi-directional environmental sensor of claim 16, wherein the temperature sensor is one of: a thermocouple, a thermistor, a resistance temperature detector, and a pyrometer.

18. The multi-directional environmental sensor of claim 15, further comprising a plurality of strain-sensing resistors that are electrically coupled to the device that measures the electrical characteristics of the multi-directional environmental sensor.

19. The multi-directional environmental sensor of claim 18, further comprising a micro-gyroscope.

20. The multi-directional environmental sensor of claim 19, further comprising a 5-line robust liquid crystal polymer-based bus line.

21. The multi-directional environmental sensor of claim 19, further comprising a device that wirelessly transmits data from the multi-directional environmental sensor.

22. The multi-directional environmental sensor of claim 15, further comprising at least one more conductive element disposed in between the inner conductive element and the outer conductive element.

23. A method of monitoring the structural properties of a cement-based structure, comprising:
   submerging at least one multi-directional environmental sensor within a cement-based mixture in its non-solid form;
      wherein the at least one multi-directional environmental sensor can obtain data pertaining to structural properties; and
   fabricating a cement-based structure to be monitored using the cement-based mixture.

* * * * *